(12) United States Patent
Fogal et al.

(10) Patent No.: US 6,607,121 B2
(45) Date of Patent: *Aug. 19, 2003

(54) QUICK CHANGE PRECISOR

(75) Inventors: Rich Fogal, Boise, ID (US); Michael B. Ball, Boise, ID (US); Ronald W. Ellis, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/139,430

(22) Filed: May 6, 2002

(65) Prior Publication Data

US 2002/0125296 A1 Sep. 12, 2002

Related U.S. Application Data

(60) Continuation of application No. 09/862,238, filed on May 22, 2001, now Pat. No. 6,390,350, which is a continuation of application No. 09/353,080, filed on Jun. 14, 1999, now Pat. No. 6,237,830, which is a division of application No. 08/794,877, filed on Feb. 5, 1997, now Pat. No. 5,971,256.

(51) Int. Cl.[7] ............................ B23K 31/02; B23K 37/04
(52) U.S. Cl. ..................... 228/180.5; 228/4.5; 228/49.5
(58) Field of Search ................................ 228/4.5, 49.5, 228/180.5, 1.1, 110.1, 212

(56) References Cited

U.S. PATENT DOCUMENTS

| | | | |
|---|---|---|---|
| 3,580,460 A | 5/1971 | Lipschutz | |
| 3,941,297 A | 3/1976 | Burns et al. | |
| 3,949,925 A | 4/1976 | Keizer et al. | |
| 4,500,031 A | 2/1985 | Pettingell | |
| 4,765,531 A | 8/1988 | Ricketson et al. | |
| 5,035,034 A | 7/1991 | Cotney | |
| 5,154,339 A | 10/1992 | Takeuchi et al. | |
| 5,176,311 A | 1/1993 | Levine et al. | |
| 5,181,646 A | 1/1993 | Ushiki et al. | |
| 5,201,450 A | 4/1993 | Ahn | |
| 5,219,404 A | 6/1993 | Moore et al. | |
| 5,238,174 A | 8/1993 | Ricketson et al. | |
| 5,307,977 A | 5/1994 | Park | |
| 5,307,978 A | 5/1994 | Ricketson et al. | |
| 5,322,207 A | 6/1994 | Fogal et al. | |
| 5,340,011 A | 8/1994 | Sanchez | |
| 5,439,159 A | 8/1995 | Takeuchi et al. | |
| 5,510,723 A | 4/1996 | Canella et al. | |
| 5,611,478 A | 3/1997 | Asanasavest | |
| 5,634,267 A | 6/1997 | Farnworth et al. | |
| 5,640,762 A | 6/1997 | Farnworth et al. | |
| 5,796,264 A | 8/1998 | Farnworth et al. | |
| 5,894,218 A | 4/1999 | Farnworth et al. | |
| 5,955,877 A | 9/1999 | Farnworth et al. | |
| 5,971,256 A | 10/1999 | Fogal et al. | |
| 6,237,830 B1 | 5/2001 | Fogal et al. | |
| 6,390,350 B2 * | 5/2002 | Fogal et al. | |

FOREIGN PATENT DOCUMENTS

| | | |
|---|---|---|
| JP | 401096940 A | 4/1989 |
| JP | 401274440 A | 11/1989 |

OTHER PUBLICATIONS

US 2001/0125296 A1 Fogal et al. (Sep. 12, 2002).*
US 2001/0025872 A1 Fogal et al. (Oct. 4, 2001).*
Kuliche and Soffa Industries, Inc., *KS 1488 Turbo*, Maintenance Manual (date unknown).

* cited by examiner

*Primary Examiner*—Tom Dunn
*Assistant Examiner*—Kiley Stoner
(74) *Attorney, Agent, or Firm*—TraskBritt

(57) ABSTRACT

A precisor plate for an automatic wire bonder having a heat block attachment portion thereon to precisely attach a heat block thereto provides a simple and quickly adjustable precisor plate and method of alignment. The precisor plate includes fixed alignment pins to align the precisor plate relative to a lead frame in an automatic wire bonding machine. In a preferred embodiment, the heat block is integral with the precisor plate and includes internal bores and or passageways for receiving a heating element, a thermocouple, and/or a vacuum source.

20 Claims, 5 Drawing Sheets

QUICK CHANGE PRECISOR

CROSS REFERENCE TO RELATED APPLICATIONS

This application is a continuation of application Ser. No. 09/862,238, filed May 22, 2001, now U.S. Pat. No. 6,390,350 B2, issued May 21, 2002, which is a continuation of application Ser. No. 09/333,080, filed Jun. 14, 1999, now U.S. Pat. No. 6,237,830, issued May 29, 2001, which is a divisional of application Ser. No. 08/794,877, filed Feb. 5, 1997, now U.S. Pat. No. 5,971,256, issued Oct. 26, 1999.

BACKGROUND OF THE INVENTION

1. Field of the Invention

This invention relates generally to work stations or work holders used in indexing semiconductor lead frames through an automatic wire bonder and, more specifically, to a precisor plate employed in such a work holder or work station adapted to be quickly readjustable to accommodate differently configured lead frames.

2. State of the Art

There are a limited number of companies in the semiconductor industry that manufacture automatic wire bonders used to form wire bonds on semiconductor devices. A leading manufacturer of such wire bonding machines is Kulicke and Soffa Industries, Inc. of Willow Grove, Pa., manufacturer of a work holder designated as model number 2810. These automatic wire bonders typically employ dedicated work holders which are adapted to receive a specifically configured lead frame. The work holders are coupled to or connected to at least three mechanical drives, one for advancing the lead frame, one for positioning the lead frame on the bonding station and one or more drives for clamping the lead frame in the station. Heretofore, changing the work holder required skilled technicians to disassemble and reassemble or partially rebuild the work holder to accommodate each differently configured lead frame and ensure that the new, differently configured lead frames will be precisely aligned with respect to the wire bonder. Such a reconfiguration process typically takes an hour or more with current work holders.

A typical work holder for a Kulicke and Soffa wire bonding machine includes a box-like frame attached to the machine through which lead frames are indexed, the box-like frame forming part of the work station at which lead frames are wire bonded. In addition, a precisor plate is attached to a vertical slider, the slider vertically moving the precisor plate beneath the lead frame. The precisor plate, in conjunction with a heat block, typically rectangular in shape, supports the lead frame in the work holder and keeps the lead frame from moving during the wire bonding operation.

An attempt to provide a modular work station or work holder which is easily removed from and replaced in an automatic wire bonder is disclosed in U.S. Pat. No. 4,765,531 ('531 patent) assigned to Kulicke and Soffa Industries, Inc., the manufacturer of the aforementioned model 2810 wire bonder. While the '531 patent is generally described with respect to Kulicke and Soffa automatic wire bonder models 1481 and 1482, many of the components and their configurations are similar to the components of the model 2810 wire AH bonder. In the '531 patent, the problem of precisely aligning the precisor plate and heat block relative to the rest of the work holder is addressed by immobilizing the entire work station while various pins and bolts align and secure these components together and to the wire bonding machine. While the quick change work station described in the '531 patent may have been an improvement over the work holder stations of its time, the '531 patent work holder requires separate alignment of both the precisor plate and the heat block.

The work holder that is provided by Kulicke and Soffa with the 2810 model is as difficult, if not more, to align than the work holder described in the '531 patent. In addition to not providing a work station that can be quickly realigned, the precisor plate provided with the 2810 model wire bonder has moveable pins that must themselves be properly aligned to precisely engage tooling holes in the lead frame. In addition, the heat block must be separately aligned, and the precisor plate itself requires planarity adjustment, both right-to-left and front-to-back.

When a wire bonder as herein described is out of service, production on that machine is lost, resulting in a decrease in manufacturing efficiency. Accordingly, in order to avoid down time for realignment of the work holder, such automatic wire bonders are kept on line as long as possible, wire bonding similarly configured lead frames. In order to accommodate low numbers of production items, where only a few parts must be wire bonded, intermittent batch production, where the configuration of the wire bonder is frequently changed, or long production runs, where realignment of the precisor plate must be periodically performed, it would be desirable to provide a quick change precisor plate that can be simply and quickly adjusted.

BRIEF SUMMARY OF THE INVENTION

Accordingly, a precisor plate and method of aligning the precisor plate to an automated wire bonding work station is herein disclosed. A first embodiment of the precisor plate in accordance with the present invention comprises a plate having fixedly attached alignment pins positioned to engage tooling holes in a lead frame or lead frame strip, whether stamped, etched or otherwise manufactured, and a heat block attachment or mounting portion on the plate for attachment of a heat -block thereto. The heat block is held in precise position relative to the precisor plate by a pin which extends from the heat block mounting portion into the heat block and an abutment surface adjacent the heat block mounting portion against which the heat block must abut in order to fit onto the pin. The heat block is secured to the heat block mounting portion by threaded screws which fit through holes provided in the heat block mounting portion and into matingly threaded holes in the heat block.

In another preferred embodiment, at least two pins are provided on the heat block mounting portion and engage an equal number of pin holes in the heat block. The pin holes, which have an internal configuration to substantially match the outer configuration of the pins, must engage with the pins and thus properly align the heat block to the precisor plate.

In yet another preferred embodiment of a precisor plate in accordance with the present invention, the precisor plate and heat block comprise a one-piece component such that the heat block is either permanently attached to the precisor plate or integrally formed as part of the precisor plate. Such a device removes entirely the need to align the heat block relative to the precisor plate, or to separately align the heat block to the work station.

The heat block according to the present invention may be provided with various internal passages, in addition to those used for securing purposes. Such internal passages may include bores sized to receive heating elements and temperature measuring devices, such as thermocouples, and passages to provide a vacuum at the wire bonding surface of the heat block to help secure the lead frame relative to the heat block during the wire bonding process.

In order to align and attach a precisor plate of the present invention to a work station, the heat block is attached to the precisor plate (if separate components) and the precisor plate is attached to a vertical slider of the wire bonding machine by inserting screws through holes provided in the precisor plate and into threaded holes provided in the slider. A lead frame is then indexed into the work station. Before tightening these screws into the threaded holes in the slider, the precisor plate is moved until, upon-actuation of the slider, the alignment pins of the precisor plate engage the tooling holes of the lead frame without disturbing the position of the lead frame. When the alignment pins can be engaged into the tooling holes without lifting (i.e., disturbing) the lead frame, the precisor plate is in the correct position and can be securely attached to the slider by tightening the screws into the slider.

To facilitate movement of the precisor plate relative to the work station, one or more holes may be formed in the precisor plate into which grasping members, such as pins or threaded screws, may be inserted. These grasping members may be grasped by a user to move the precisor plate relative to the work station. After proper alignment and upon securement of the precisor plate relative to the work station, the grasping members may be removed.

DETAILED DESCRIPTION OF THE INVENTION

Figure 1A:
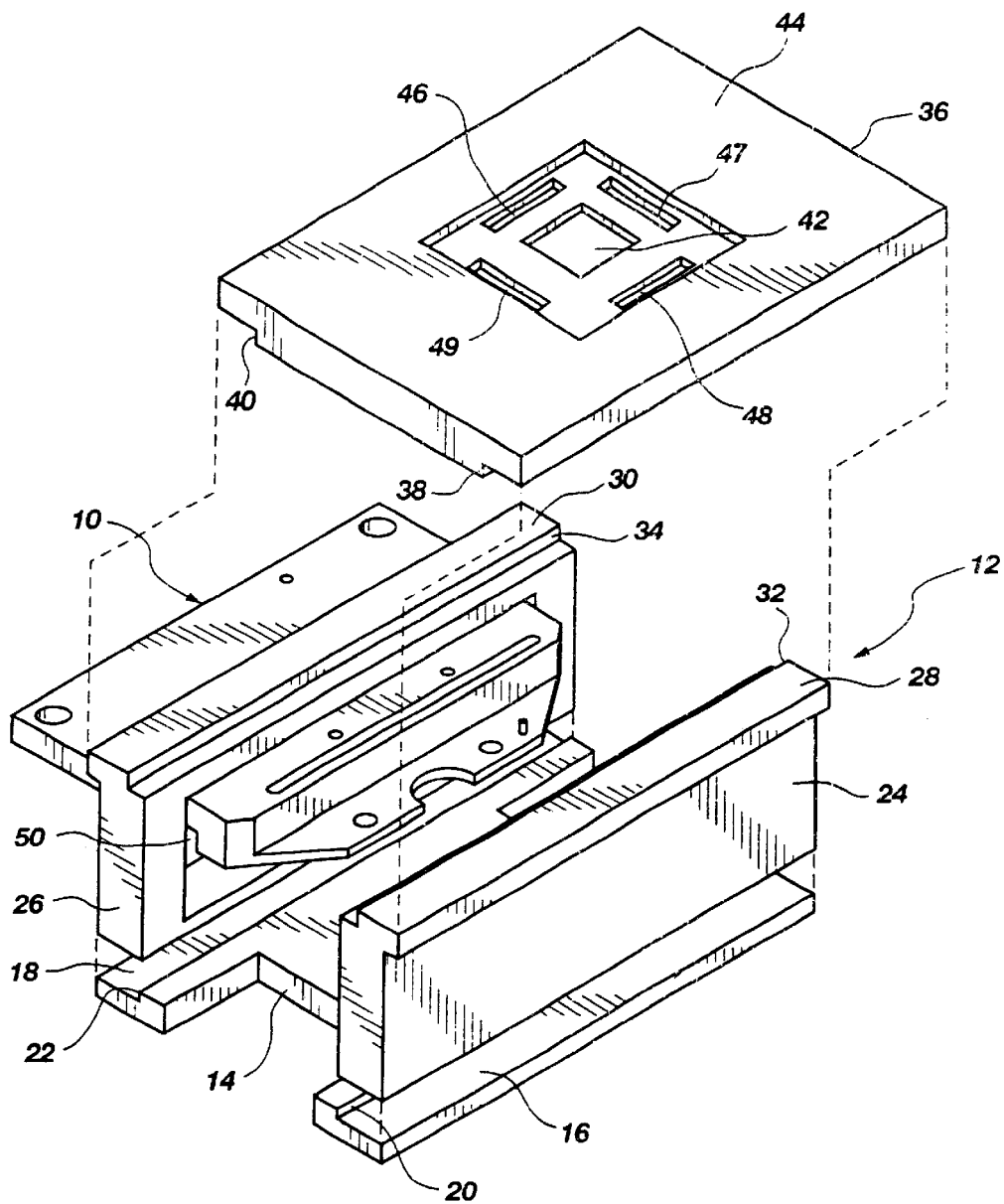
FIG. 1A is an isometric exploded view of a first embodiment of a precisor plate in accordance with the present invention positioned within a work station of a wire bonding machine.

FIG. 1A illustrates a precisor plate 10 in accordance with the present invention positioned within a modular, box-shaped work station 12 known in the art. The work station 12 is comprised of a bottom plate 14 having a pair of rail guides 16 and 18 consisting of longitudinally extending steps providing abutting edges 20 and 22 against which a pair of side rails 24 and 26 can be positioned, respectively. The tops 28 and 30 of the side rails 24 and 26 are also provided with longitudinally extending abutment surfaces 32 and 34 for holding a top plate 36 along similarly configured longitudinally extending abutment surfaces 38 and 40 of the top plate 36. The top plate 36 is provided with a first major opening 42 defined in the top surface 44 of the top plate 36. The opening 42 provides access to the lead frame and die (not shown) that are to be wire bonded by a wire bonding head of a wire bonding machine to which the work station 12 is attached. Other apertures or openings 46, 47, 48, and 49 defined in the top plate 36 may also be provided for positioning and/or access purposes.

The side rail 26 defines an opening 50 therein large enough to receive the precisor plate 10 and allow vertical movement of the precisor plate 10 within the opening 50. When assembled, the work station 12 in conjunction with the precisor plate 10 helps to provide physical, immobile support for a lead frame during the wire bonding process to ensure that the lead frame does not move. In addition, movement of the precisor plate 10 relative to the work station 12 is provided to allow lead frames to be indexed into and out of the work station 12.

Figures 1B, 1C:
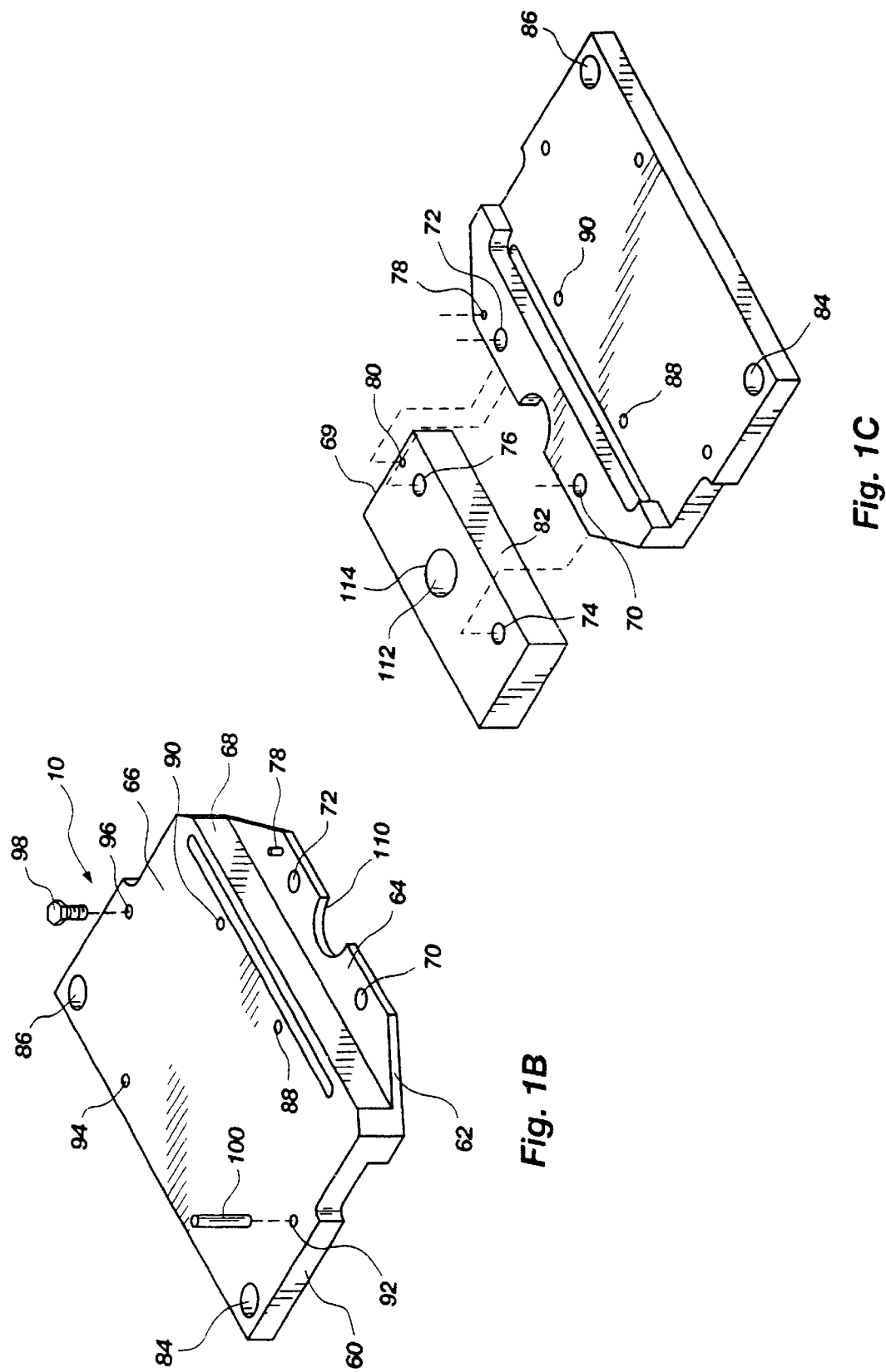
FIG. 1B is an isometric top view of the precisor plate of FIG. 1A.
FIG. 1C is an isometric bottom view of the precisor plate of FIG. 1A with an associated heat block.

As better illustrated in FIGS. 1B and 1C, the precisor plate 10 is a one-piece component comprised of a plate 60 having a heat block attachment portion or ledge 62 depending therefrom, the ledge 62 having a top surface 64 on a different horizontal plane than a top surface 66 of the plate 60. A heat block abutment surface 68 is provided between and substantially perpendicular to the plate 60 and the ledge 62. In order to attach a heat block 69 to the precisor plate 10 and properly position it relative to the precisor plate 10, holes 70 and 72 are provided in the ledge 62 configured to match the position of threaded holes 74 and 76 in the heat block 69. The holes 70 and 72 are spaced from the abutment surface 68 substantially the same distance as the holes 74 and 76 are spaced from the abutment side 82 of the heat block 69. In addition, a pin 78 attached to the top surface 64 of the ledge 62 is positioned to engage pin hole 80 in the heat block 69 with the pin 78 being spaced from the abutment surface 68 substantially the same distance the pin hole 80 is from the abutment side 82. Accordingly, the combination of abutting the abutment side 82 of heat block 69 against the abutment surface 68 and engaging the pin 78 into the pin hole 80 results in a properly positioned and aligned heat block 69 relative to the precisor plate 10. Threaded screws (not shown), as known in the art, can then be inserted through holes 70 and 72 and engaged with threaded holes 74 and 76, respectively, so that the heat block 69 is immobilized in proper alignment relative to the precisor plate 10.

The ledge 62 also defines a semicircular opening 110 to allow access through the ledge 62 to the opening 112 of internal bore 114 in the heat block 69 by the wire bonding machine, as will be further described with reference to FIG. 4.

The plate 60 of the precisor plate 10 is also provided with other holes, both threaded and unthreaded. For example, holes 84 and 86 are defined through the plate 60 to attach the precisor plate 10 to a wire bonding machine. In addition, holes 88 and 90 are positioned to substantially match the spacing of tooling holes provided in a lead frame strip as is known in the art. Alignment pins (see FIG. 4) can then be secured into the holes 88 and 90. Other holes 92, 94, and 96 are positioned about the top surface 66 of the plate 60 into which a grasping member such as a threaded fastener 98 can be attached if holes 92, 94, and 96 are internally threaded, or a pin 100 sized to match the size of the holes 92, 94, or 96 if holes 92, 94, and 96 are not threaded. The threaded fasteners 98 and/or pins 100 can be grasped to move the precisor plate 10 to the work station 12 while aligning the precisor plate 10 to the work station 12, as will be subsequently described. After proper alignment of the precisor plate 10, the threaded fasteners 98 and/or pins 100 can be removed from the precisor plate 10 and are not otherwise necessary for the wire bonding process.

Figure 2:
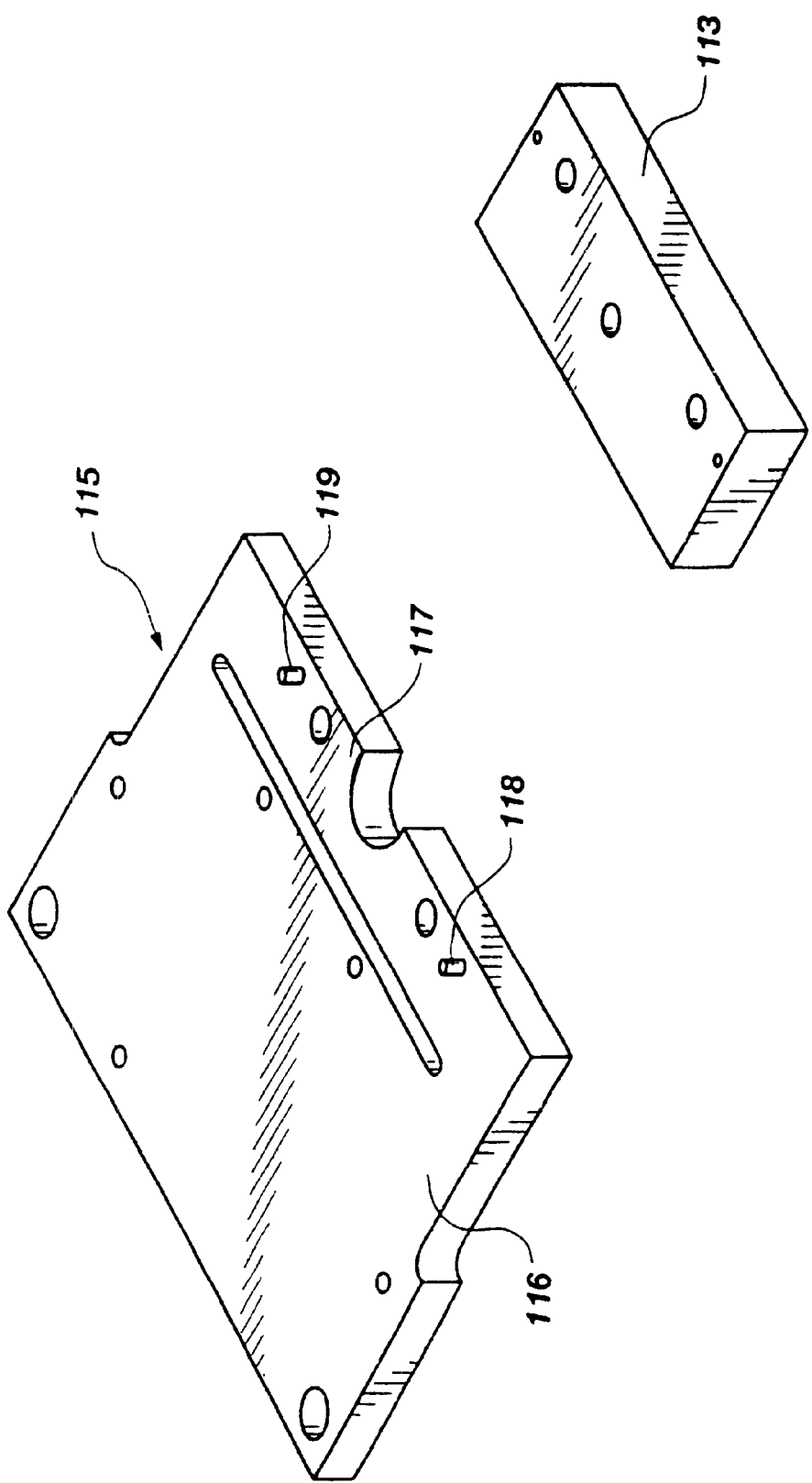
FIG. 2 is an isometric top view of a second embodiment of a precisor plate in accordance with the present invention.

It is also contemplated, as illustrated in FIG. 2, that multiple pins 118 and 119 or other positioning members such as raised and/or recessed portions may be employed to align a heat block 113 to a precisor plate 115 of the present invention so that, in contrast to the configuration shown in FIG. 1B, the abutment surface 68 and ledge 62 are not required. Accordingly, such a precisor plate 115 could be formed from a plate 116 having a top surface 117 in a single plane with the heat block 113 attached directly to the top surface 117 of the plate 116.

Figure 3A:
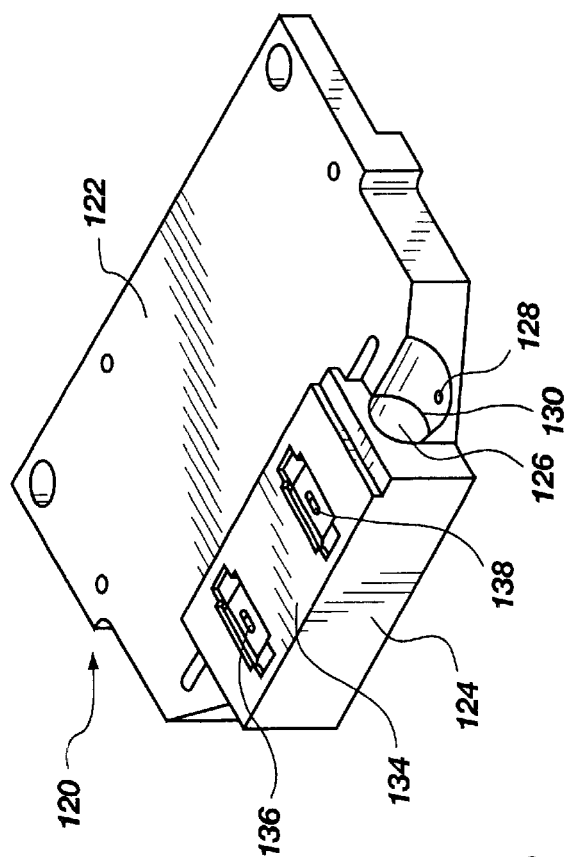
FIG. 3A is an isometric top view of a third embodiment of a precisor plate in accordance with the present invention.
Figure 3B:
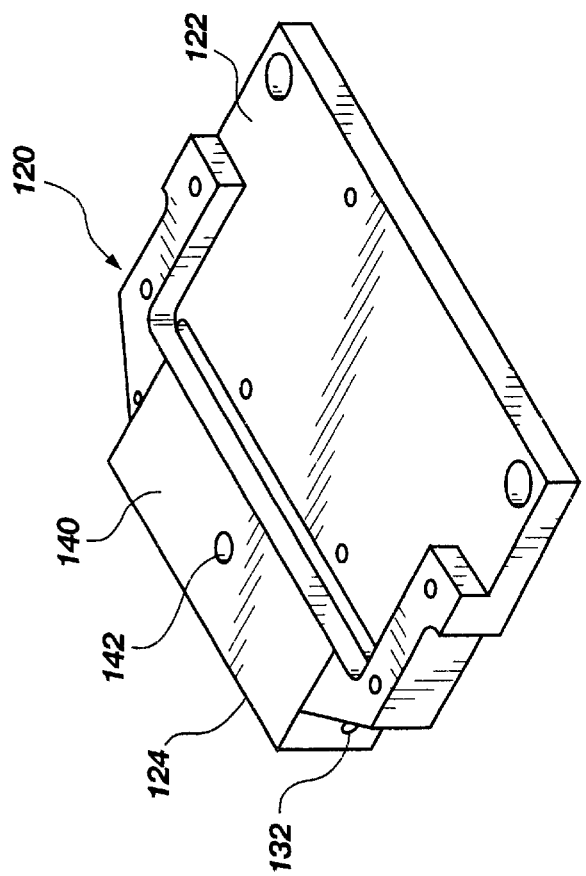
FIG. 3B is an isometric bottom view of the precisor plate of FIG. 3A.

Referring now to FIGS. 3A and 3B, another preferred embodiment of a precisor plate 120 according to the present invention is illustrated. Similar to the precisor plate 10 of FIGS. 1A, 1B and 1C, the precisor plate 120 is comprised of a single element 122. The heat block 124, however, is integral with the single element plate 122 and may be formed as a single piece with the precisor plate 120. The heat block 124 may be provided with various passages such as an internal bore 126 extending therein and sized to receive a heating element (not shown) in a male/female relationship. A hole 128 may also be provided proximate the opening 130 of the internal bore 126 to which the heating element (not shown) may be secured. As shown in FIG. 3B, the heat block 124 may also include another bore 132 therein into which a thermocouple (not shown) can be inserted to monitor the temperature of the heat block 124. Referring again to FIG. 3A, the top surface 134 of the heat block 124 may also have a pair of vacuum outlet ports 136 and 138 through which a vacuum may be drawn to assist in immobilizing a lead frame until the heat block 124 abuts the top plate 36 (see FIG. 4). Referring again to FIG. 3B, in the bottom surface 140 of the heat block 124, a vacuum inlet port 142 in communication with vacuum outlet ports 136 and 138 can be attached to a vacuum source of a wire bonding machine.

Figure 4:
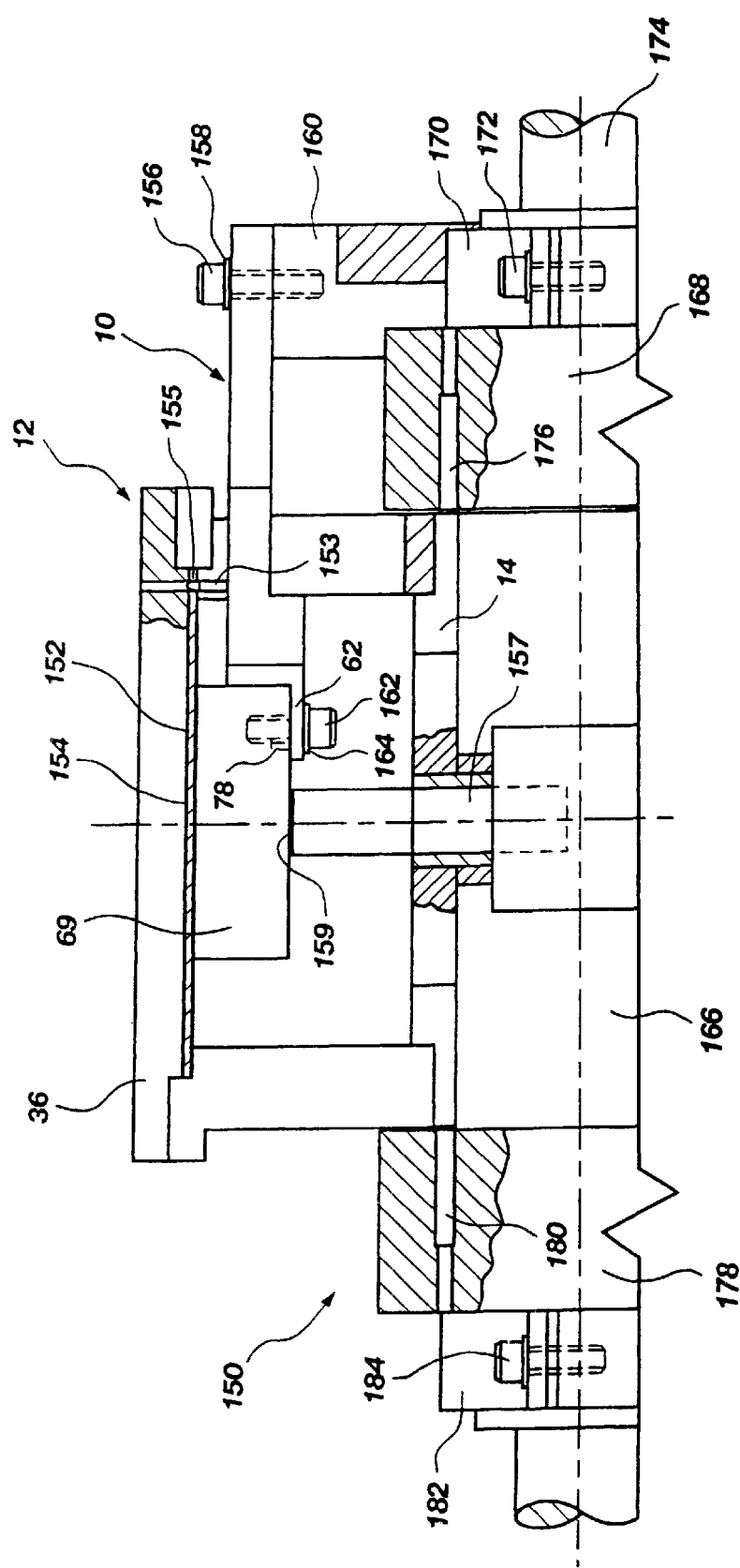
FIG. 4 is a side cut-away view of the precisor plate of FIG. 1A positioned within the work holder and attached to a wire bonding machine.

FIG. 4 illustrates the precisor plate 10 attached to a wire bonding machine 150 known in the art. A lead frame 152 is in a bonding position within the work station 12 with the heat block 69 holding the lead frame 152 against the bottom surface 154 of the top plate 36. Alignment pins 153 engage the index or tooling holes 155 in the lead frame 152.

After being clamped in position by the heat block 69, the lead frame 152 is further supported by an air cylinder 157 which is located inside a center frame 166 of the wire bonding machine 150 and which engages the heat block 69. The additional force provided by air cylinder 157 further stabilizes the heat block 69 so that the lead frame 152 is more solidly held in the wire bonding machine 150. In addition, the air cylinder 157 may provide a vacuum source 159 to the heat block 69 through internal passages (not shown) in the air cylinder 157 connected to a vacuum outlet (not shown) in the wire bonding machine 150 so that, as previously described, the lead frame 152 is held in position relative to the heat block 69 until the heat block 69 abuts the top plate 36. After the bonding operation, drive rollers (not shown), as are known on such wire bonding machines, actuated by the wire bonding machine 150 move the lead frame 152 to the next index position once the alignment pins 153 are lowered out of the index holes 155 of the lead frame 152.

The precisor plate 10 is attached by screw 156 and lock washer 158 to vertical slider 160 that vertically moves the precisor plate 10 up and down relative to the work station 12. The slider 160 is mounted for movement on a movable front frame member 168 which is locked in place by a split clamp 170 and screw 172. The front frame member 168 is movable on a pair of shaft members 174 (only one of which is shown) and, when properly indexed by a set screw 176 engaging a side edge of the bottom plate 14, positions both the front frame member 168 and the slider 160 in the proper operating position. Similarly, the rear frame member 178 is movable on the same shaft members 174, which is a part of the base of the automatic wire bonding machine, and is set in place by set screws 180 engaging the bottom plate 14. There is also provided a split clamp 182 and screw 184 to hold the rear frame member 178 in place. The heat block 69 is attached to the ledge 62 of the precisor plate 10 by screw 162 and lock washer 164 and further held in position by pin 78.

In practice, the work station 12 is first mounted on the center frame 166 and the precisor plate is attached to the slider 160. The screw 156 is tightened enough to hold the precisor plate to the slider 160 but is loose enough to allow movement of the precisor plate 10 relative to the slider 160. In a lowered position and with the top plate 36 removed, the precisor plate 10 is moved relative to the slider 160 until alignment pins are positioned proximately below the tooling or index holes 155 of the lead frame 152. Grasping members such as threaded fasteners 98 and/or pins 100 as illustrated in FIG. 1B may be employed to assist movement of the precisor plate 10. The precisor plate 10 is then raised by the slider 160 to ensure that the alignment pins 153 do not substantially disturb the position of the lead frame 152. Typically, such disturbance can be detected by observing vertical movement of the lead frame 152 by the alignment pins 153. If the alignment pins 153 do not precisely engage the index holes 155 of the lead frame 152, the precisor plate 10 can be adjusted until the alignment pins 153 fit (i.e., ±1 mil between the centers of alignment pins 153 and index holes 155) within the index holes 155 without lifting the lead frame 152. Once the precisor plate 10 is in position, the screws 156 can be tightened to secure the precisor plate 10 relative to the rest of the work station 12.

It is noted that other configurations of modular work stations may also be employed in accordance with the precisor plate 10 of the present invention. Thus, while a modular work station as herein described has been shown with respect to a Kulicke and Soffa Industries, Inc. wire bonding machine, it is contemplated that a precisor plate in accordance with the present invention may be adapted to and/or utilized with other wire bonding machines and work stations known in the art. Those skilled in the art will also appreciate that various combinations and modifications of the preferred embodiments may be made without departing from the spirit of this invention and the accompanying claims.

What is claimed is:

1. A work holder in a wire bonding machine, comprising:
    a bottom plate having a first rail guide at a first side thereof and a second, parallel rail guide at a second side thereof;
    a first side rail and a second side rail, said first side rail engaging said first rail guide and said second side rail engaging said second rail guide, said second side rail defining a precisor plate-receiving opening therethrough;
    a top plate having a bottom surface received on said first and second side rails;
    a vertical slide positioned proximate said second side rail;
    a precisor plate attached to said vertical slide and extending through said precisor plate-receiving opening; and
    a heat block attached to said precisor plate having a top surface positioned below said bottom surface of said top plate.

2. The work holder of claim 1, further comprising at least one alignment pin coupled to said precisor plate, said at least one alignment pin being sized and configured to engage a tooling hole of a lead frame.

3. The work holder of claim 1, wherein said precisor plate further comprises a ledge surface and wherein at least a portion of a lower surface of said heat block is attached to said ledge surface.

4. The work holder of claim 3, wherein said precisor plate further comprises an abutment surface substantially perpendicular to said ledge surface and wherein at least a portion of a side surface of said heat block contacts said abutting surface of said precisor plate.

5. The work holder of claim 3, further comprising at least one alignment pin located and configured to align said heat block with said precisor plate.

6. The work holder of claim 1, wherein said precisor plate is adjustable relative to said vertical slide along a plane which is substantially parallel with said bottom surface of said top plate.

7. The work holder of claim 1, wherein said heat block defines at least one passage between said top surface of said heat block and a bottom surface of said heat block.

8. A heat block for a wire bonding machine having a precisor plate attached thereto comprising:
a heat block having an attachment surface defining at least one precisor alignment member-receiving portion and an abutment surface for abutting a surface of the precisor plate.

9. The heat block of claim 8, wherein the attachment surface is substantially perpendicular with the abutment surface.

10. The heat block of claim 8, further comprising at least one passage defined through the heat block including an outlet located in an upper surface opposing the attachment surface.

11. The heat block of claim 8, further comprising a first bore defined in the heat block sized and configured to receive a heating element therein.

12. The heat block of claim 11, further comprising a second bore defined in the heat block sized and configured to receive a thermocouple therein.

13. The heat block of claim 8, wherein the heat block defines at least one internally threaded opening through the attachment surface.

14. A kit for a precisor plate used in a wire bonding machine, comprising:
a precisor plate having a heat block attachment portion thereon;
a heat block for attaching to said heat block attachment portion; and
a pair of alignment pins to be fixedly attached to said precisor plate and spaced to engage tooling holes in a lead frame.

15. The kit of claim 14, wherein said attachment portion of said precisor plate includes a first surface and a second surface substantially perpendicular to said first surface.

16. The kit of claim 15, wherein said pair of alignment pins are configured to be fixedly attached to said first surface of said attachment portion and wherein said second surface of said attachment portion is configured to abut a surface of said heat block.

17. The kit of claim 14, wherein said heat block defines at least one passage therethrough from a first surface of said heat block to a second surface of said heat block.

18. The kit of claim 14, further comprising at least one fastener for securement of said heat block to said heat block attachment portion of said precisor plate.

19. A method of wire bonding a first plurality of lead frames and a second plurality of lead frames, each having indexing holes therein, comprising:
wire bonding the first plurality of lead frames with a wire bonding machine having a precisor plate in a first position, the precisor plate having at least two alignment pins attached thereto;
changing the position of the precisor plate by loosening the precisor plate from the wire bonding machine so that the precisor plate can be moved relative to a slider;
raising the precisor plate until the at least two alignment pins of the precisor plate engage the indexing holes of a lead frame of a second plurality of lead frames;
moving the precisor plate relative to the second plurality of lead frames until the at least two alignment pins precisely engage the indexing holes of the lead frame of the second plurality of lead frames without substantial contact therewith;
fastening the precisor plate to the wire bonding machine; and
wire bonding the second plurality of lead frames.

20. The method claim 19, comprising wire bonding a third plurality of lead frames including:
changing the position of the precisor plate a second time by loosening the precisor plate from the wire bonding machine so that the precisor plate can be moved relative to the slider;
raising the precisor plate until the at least two alignment pins of the precisor plate engage the indexing holes of a lead frame of the third plurality of lead frames;
moving the precisor plate relative to the third plurality of lead frames until the at least two alignment pins precisely engage the indexing holes of the lead frame of the third plurality of lead frames without substantial contact with the lead frame of the third plurality of lead frames;
refastening the precisor plate to the wire bonding machine; and
wire bonding the third plurality of lead frames.

* * * * *

UNITED STATES PATENT AND TRADEMARK OFFICE
CERTIFICATE OF CORRECTION

PATENT NO. : 6,607,121 B2
DATED : August 19, 2003
INVENTOR(S) : Rich Fogal, Michael B. Ball and Ronald W. Ellis It is certified that error appears in the above-identified patent and that said Letters Patent is hereby corrected as shown below:

Title page,
Item [60], Related U.S. Application Data, change "09/353,080" to -- 09/333,080 --
Item [57], ABSTRACT,
Line 9, change "and or" to -- and/or --

Signed and Sealed this

Fourth Day of January, 2005

JON W. DUDAS
*Director of the United States Patent and Trademark Office*